(12) United States Patent
Wu

(10) Patent No.: US 11,696,519 B2
(45) Date of Patent: Jul. 4, 2023

(54) PHASE-CHANGE MEMORY AND METHOD OF FORMING SAME

(71) Applicant: Taiwan Semiconductor Manufacturing Co., Ltd., Hsinchu (TW)

(72) Inventor: Jau-Yi Wu, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/666,230

(22) Filed: Feb. 7, 2022

(65) Prior Publication Data

US 2022/0158089 A1 May 19, 2022

Related U.S. Application Data

(62) Division of application No. 16/727,363, filed on Dec. 26, 2019, now Pat. No. 11,245,072.

(51) Int. Cl.
| | |
|---|---|
| *H01L 45/00* | (2006.01) |
| *H01L 27/24* | (2006.01) |
| *H10N 70/00* | (2023.01) |
| *H10B 63/00* | (2023.01) |
| *H10N 70/20* | (2023.01) |

(52) U.S. Cl.
CPC ........ *H10N 70/826* (2023.02); *H10B 63/30* (2023.02); *H10N 70/021* (2023.02); *H10N 70/231* (2023.02); *H10N 70/841* (2023.02)

(58) Field of Classification Search
None
See application file for complete search history.

(56) References Cited

U.S. PATENT DOCUMENTS

| | | | |
|---|---|---|---|
| 10,566,385 B2 | 2/2020 | Lee et al. | |
| 2015/0263279 A1 | 9/2015 | Hayakawa et al. | |
| 2016/0268336 A1* | 9/2016 | Shum | H10B 61/22 |
| 2017/0053965 A1 | 2/2017 | Baek et al. | |
| 2017/0117467 A1 | 4/2017 | Chang et al. | |
| 2017/0207387 A1* | 7/2017 | Yang | H10N 70/821 |
| 2019/0058109 A1* | 2/2019 | Chen | H01L 21/76877 |

* cited by examiner

*Primary Examiner* — Mounir S Amer
(74) *Attorney, Agent, or Firm* — Slater Matsil, LLP

(57) ABSTRACT

A device and a method of forming the same are provided. The device includes a substrate, a first dielectric layer over the substrate, a bottom electrode extending through the first dielectric layer, a first buffer layer over the bottom electrode, a phase-change layer over the first buffer layer, a top electrode over the phase-change layer, and a second dielectric layer over the first dielectric layer. The second dielectric layer surrounds the phase-change layer and the top electrode. A width of the top electrode is greater than a width of the bottom electrode.

20 Claims, 16 Drawing Sheets

PHASE-CHANGE MEMORY AND METHOD OF FORMING SAME

PRIORITY CLAIM AND CROSS-REFERENCE

This application is a division and claims the benefit of U.S. patent application Ser. No. 16/727,363, filed on Dec. 26, 2019, which application is hereby incorporated herein by reference.

BACKGROUND

Phase change technology is promising for next generation memories. It uses chalcogenide semiconductors for storing states. The chalcogenide semiconductors, also called phase change materials, have a crystalline state and an amorphous state. In the crystalline state, the phase change materials have a low resistivity, while in the amorphous state they have a high resistivity. The resistivity ratios of the phase change materials in the amorphous and crystalline states are typically greater than 1000 and thus the phase change memory devices are unlikely to have erroneous reading. The chalcogenide materials are stable at certain temperature ranges in both crystalline and amorphous states and can be switched back and forth between the two states by electric pulses. One type of memory device that uses the principal of phase change in chalcogenide semiconductors is commonly referred to as phase-change random access memory (PCRAM).

PCRAM has several operating and engineering advantages, including high speed, low power, non-volatility, high density, and low cost. For example, PCRAM devices are non-volatile and may be written into rapidly, for example, within less than about 50 nanoseconds. The PCRAM cells may have a high density. In addition, PCRAM memory cells are compatible with CMOS logic and can generally be produced at a low cost compared to other types of memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
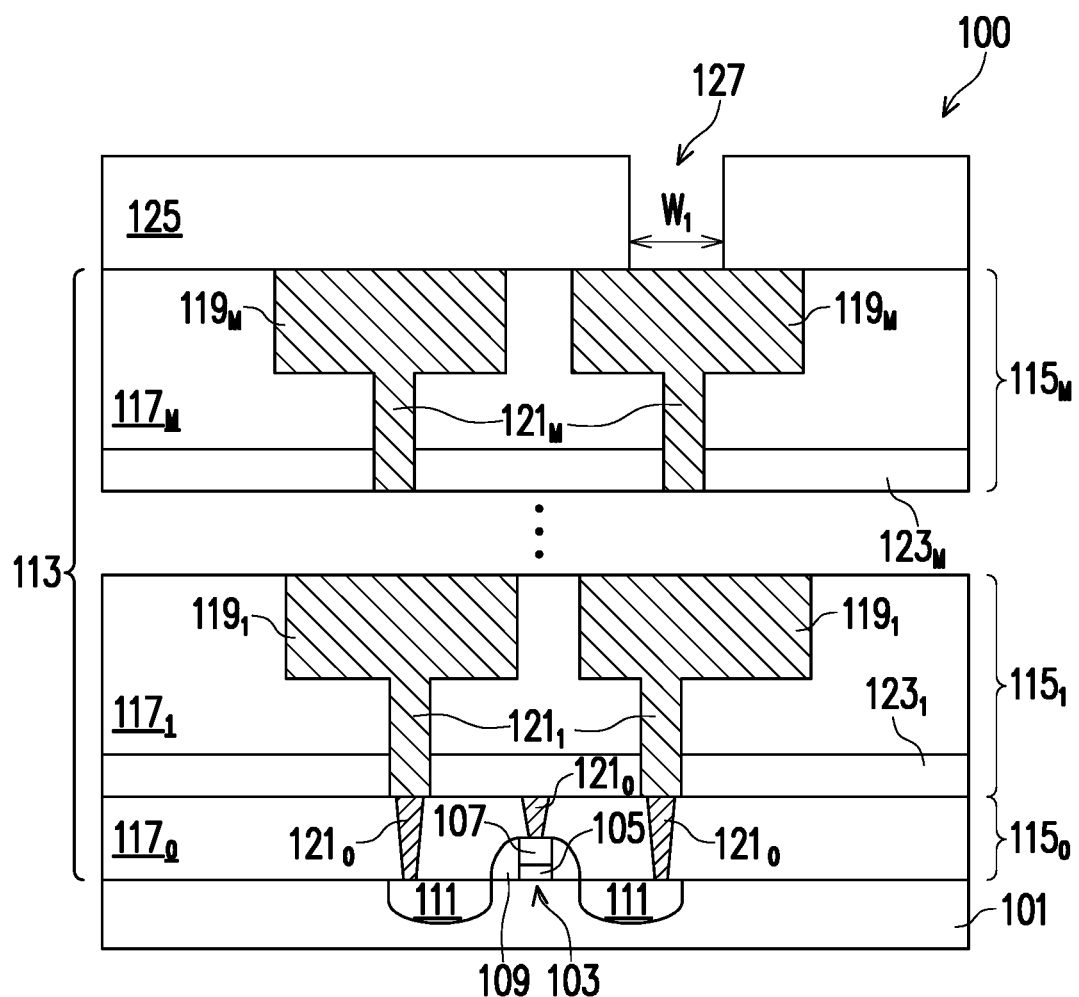
FIGS. 1-4 illustrate cross-sectional views of intermediate stages in the manufacturing of a phase-change random access memory (PCRAM) cell in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a semiconductor device, such a phase-change random access memory (PCRAM) device, and a method of forming the same. By forming buffer layers between top and bottom electrodes and a phase-change material layer, metal diffusion from the top and bottom electrodes into the phase-change material layer may be reduced or avoided. By avoiding the metal contamination in the phase-change material layer, read/write cycling endurance of a PCRAM device may be improved.

FIGS. 1-4 illustrate cross-sectional views of intermediate stages in the manufacturing of a PCRAM cell 100 in accordance with some embodiments. In some embodiments, the PCRAM cell 100 comprises a substrate 101. The substrate 101 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 101 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, an access transistor 103 is formed over the substrate 101. The access transistor 103 includes a gate stack comprising a gate dielectric 105 and a gate electrode 107, spacers 109 on opposite sidewalls of the gate stack, and source/drain regions 111 adjacent to the respective spacers 109. For simplicity, components that are commonly formed in integrated circuits, such as gate silicides, source/drain silicides, contact etch stop layers, and the like, are not illustrated. In some embodiments, the access transistor 103 may be formed using any acceptable methods. In some embodiments, the access transistor 103 may be a planar MOSFET, a FinFET, or the like.

In some embodiments, additional active and/or passive devices may be formed on the substrate 101. The one or more active and/or passive devices may include transistors, capacitors, resistors, diodes, photo-diodes, fuses, or the like. The one or more active and/or passive devices may be formed using any acceptable methods. One of ordinary skill in the art will appreciate that the above examples are provided for the purpose of illustration only and are not meant to limit the present disclosure in any manner. Other circuitry may be also used as appropriate for a given application.

In some embodiments, an interconnect structure 113 is formed over the access transistor 103 and the substrate 101. The interconnect structure 113 may comprise one or more metallization layers $115_0$ to $115_M$, wherein M+1 is the number of the one or more metallization layers $115_0$ to $115_M$. In some embodiments, the value of M may vary according to design specifications. In some embodiments, the metallization layer $115_M$ may be an intermediate metallization layer of the interconnect structure 113. In such embodiments, further metallization layers are formed over the metallization layer $115_M$. In some embodiments, M is equal to 1. In other embodiments, M is greater than 1.

In some embodiments, the one or more metallization layers $115_0$ to $115_M$, comprise one or more dielectric layers $117_0$ to $117_M$, respectively. The dielectric layer $117_0$ is an inter-layer dielectric (ILD) layer, and the dielectric layers $117_1$ to $117_M$ are inter-metal dielectric (IMD) layers. The ILD layer and the IMD layers may include low-k dielectric materials having k values, for example, lower than about 4.0 or even 2.0. In some embodiments, the ILD layer and IMD layers may be made of, for example, phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, formed by any suitable method, such as spin-on coating, chemical vapor deposition (CVD), plasma-enhanced CVD (PECVD), atomic layer deposition (ALD), a combination thereof, or the like.

In some embodiments, etch stop layers (ESLs) $123_1$ to $123_M$ are formed between adjacent ones of the dielectric layers $117_0$ to $117_M$. A material for the ESLs $123_1$ to $123_M$ is chosen such that etch rates of the ESLs $123_1$ to $123_M$ are less then etch rates of corresponding ones of the dielectric layers $117_1$ to $117_M$. In some embodiments, an etching process that etches the dielectric layers $117_1$ to $117_M$ faster than the ESLs $123_1$ to $123_M$ is a dry etching process performed using an etchant comprising a $C_xF_y$-based gas, or the like. In some embodiments, an etch rate of the ESL $123_K$ is less than an etch rate of the dielectric layer $117_K$ (with K=1, ... , M). In some embodiments, each of the ESLs $123_1$ to $123_M$ may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), carbides (such as SiC, or the like), combinations thereof, or the like, and may be formed using spin-on coating, CVD, PECVD, ALD, a combination thereof, or the like.

In some embodiments, the metallization layer $115_0$ further comprises conductive plugs $121_0$ within the dielectric layer $117_0$, and the metallization layers $115_1$ to $115_M$ further comprise one or more conductive interconnects, such as conductive lines $119_1$ to $119_M$ and conductive vias $121_1$ to $121_M$, within the dielectric layers $117_1$ to $117_M$, respectively. The conductive plugs $121_0$ electrically couple the source/drain regions 111 and the gate electrode 107 of the access transistor 103 to the conductive lines $119_1$ to $119_M$ and the conductive vias $121_1$ to $121_M$.

In some embodiments, the conductive plugs $121_0$, the conductive lines $119_1$ to $119_M$ and the conductive vias $121_1$ to $121_M$ may be formed using any suitable method, such as a damascene method, a dual damascene method, or the like. In some embodiments, the steps for forming the conductive plugs $121_0$, the conductive lines $119_1$ to $119_M$ and the conductive vias $121_1$ to $121_M$ include forming openings in the respective dielectric layers $117_0$ to $117_M$, depositing one or more barrier/adhesion layers (not explicitly shown) in the openings, depositing seed layers (not explicitly shown) over the one or more barrier/adhesion layers, and filling the openings with a conductive material (not explicitly shown). A chemical mechanical polishing (CMP) is then performed to remove excess materials of the one or more barrier/adhesion layers, the seed layers, and the conductive material overfilling the openings. In some embodiments, topmost surfaces of the conductive plugs $121_0$ are substantially coplanar or level with a topmost surface of the dielectric layer $117_0$ within process variations of the CMP process. In some embodiments, topmost surfaces of the conductive lines $119_1$ to $119_M$ are substantially coplanar or level with topmost surface of the dielectric layers $117_1$ to $117_M$, respectively, within process variations of the CMP process.

In some embodiments, the one or more barrier/adhesion layers may comprise titanium, titanium nitride, tantalum, tantalum nitride, a combination thereof, a multilayer thereof, or the like, and may be formed using physical vapor deposition (PVD), CVD, ALD, a combination thereof, or the like. The one or more barrier/adhesion layers protect the respective dielectric layers $117_0$ to $117_M$ from diffusion and metallic poisoning. The seed layers may comprise copper, titanium, nickel, gold, manganese, a combination thereof, a multilayer thereof, or the like, and may be formed by ALD, CVD, PVD, sputtering, a combination thereof, or the like. The conductive material may comprise copper, aluminum, tungsten, combinations thereof, alloys thereof, multilayers thereof, or the like, and may be formed using, for example, by plating, or other suitable methods.

Referring further to FIG. 1, a dielectric layer 125 is formed over the metallization layer $115_M$. In some embodiments, the dielectric layer 125 may be formed using similar materials and methods as the dielectric layers $117_0$ to $117_M$ and the description is not repeated herein. In some embodiments, the dielectric layer 125 may have a thickness between about 40 nm and about 80 nm. Such a range of the thickness of the dielectric layer 125 allows for integrating processes for forming the PCRAM cell 100 with logic processes. In some embodiments, the dielectric layer 125 is patterned to form an opening 127 in the dielectric layer 125. The patterning process may include suitable photolithography and etching methods. In some embodiments, the opening 127 exposes underlying conductive line $119_M$. In some embodiments, the opening 127 has a width $W_1$ between about 5 nm and about 40 nm. Such a range of the width of the opening 127 allows for reducing a write current and a write power of the PCRAM cell 100.

Figure 2:
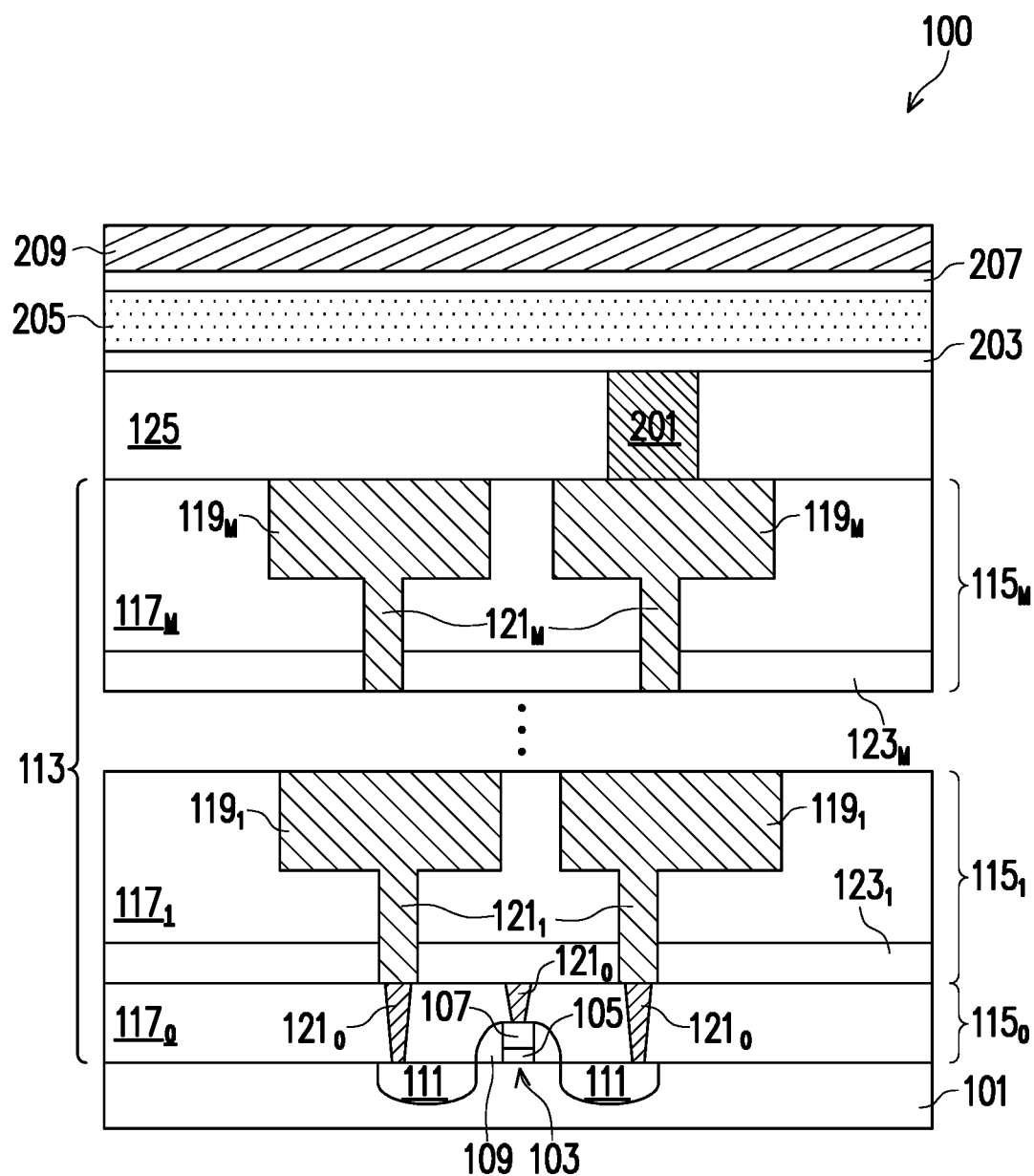

Referring to FIG. 2, a conductive layer 201 is formed in the opening 127 (see FIG. 1). In some embodiments, the conductive layer 201 may comprise a conductive material such as Ti, Co, W, Ru, C, WN, TiN, TiW, TiAl, TiAlN, a combination thereof, a multilayer thereof, or like, and may be formed using CVD, ALD, PVD, a combination thereof, or the like. In some embodiments, the conductive material is deposited in the opening 127 and may overfill the opening 127. In some embodiments, a planarization process, such as a CMP process, an etching process, a grinding process, a combination thereof, or the like, is performed on the conductive material to remove excess portions of the conductive material overfilling the opening 127. In such embodiments, a topmost surface of the conductive layer 201 substantially coplanar or level with a topmost surface of the dielectric layer 125 within process variations of the planarization process. The conductive layer 201 may also be referred to as a bottom electrode. The conductive layer 201 has a width that is equal to the width $W_1$ of opening 127 (see FIG. 1).

In some embodiments, a buffer material 203 is blanket deposited over the dielectric layer 125 and the conductive layer 201. The buffer material 203 may comprise amorphous carbon, W, WN, TaN, Ru, graphene, $MoS_2$, $WS_2$, a combination thereof, a multilayer thereof, or the like, and may be formed using CVD, ALD, PVD, a combination thereof, or the like. In some embodiments, the buffer material 203 has a thickness between about 1 nm and about 10 nm.

In some embodiments, a phase-change material 205 is blanket deposited over the buffer material 203. The phase-change material 205 may comprise chalcogenide materials including one or more of Ge, Te, and Sb, e.g., which may be GeSbTe, or stoichiometric materials. The phase-change material 205 may be formed using ALD, CVD, PECVD, a combination thereof, or the like. In some embodiments, the phase-change material 205 has a thickness between about 20 nm and about 100 nm. Such a range of the thickness of the phase-change material 205 allows for integrating processes for forming the PCRAM cell 100 with logic processes.

In some embodiments, a buffer material 207 is blanket deposited over the phase-change material 205. The buffer material 207 may be formed using similar materials and methods as the buffer material 203 and the description is not repeated herein. In some embodiments, the buffer material 203 and the buffer material 207 comprise a same material. In other embodiments, the buffer material 203 and the buffer material 207 comprise different materials. In some embodiments, the buffer material 207 has a thickness between about 1 nm and about 10 nm.

In some embodiments, a conductive material 209 is blanket deposited over the buffer material 207. In some embodiments, the conductive material 209 may be formed using similar materials and methods as the conductive layer 201 and the description is not repeated herein. In some embodiments, the conductive layer 201 and the conductive material 209 may comprise a same material. In other embodiments, the conductive layer 201 and the conductive material 209 may comprise different materials. In some embodiments, the conductive material 209 has a thickness between about 10 nm and about 20 nm.

Figure 3:
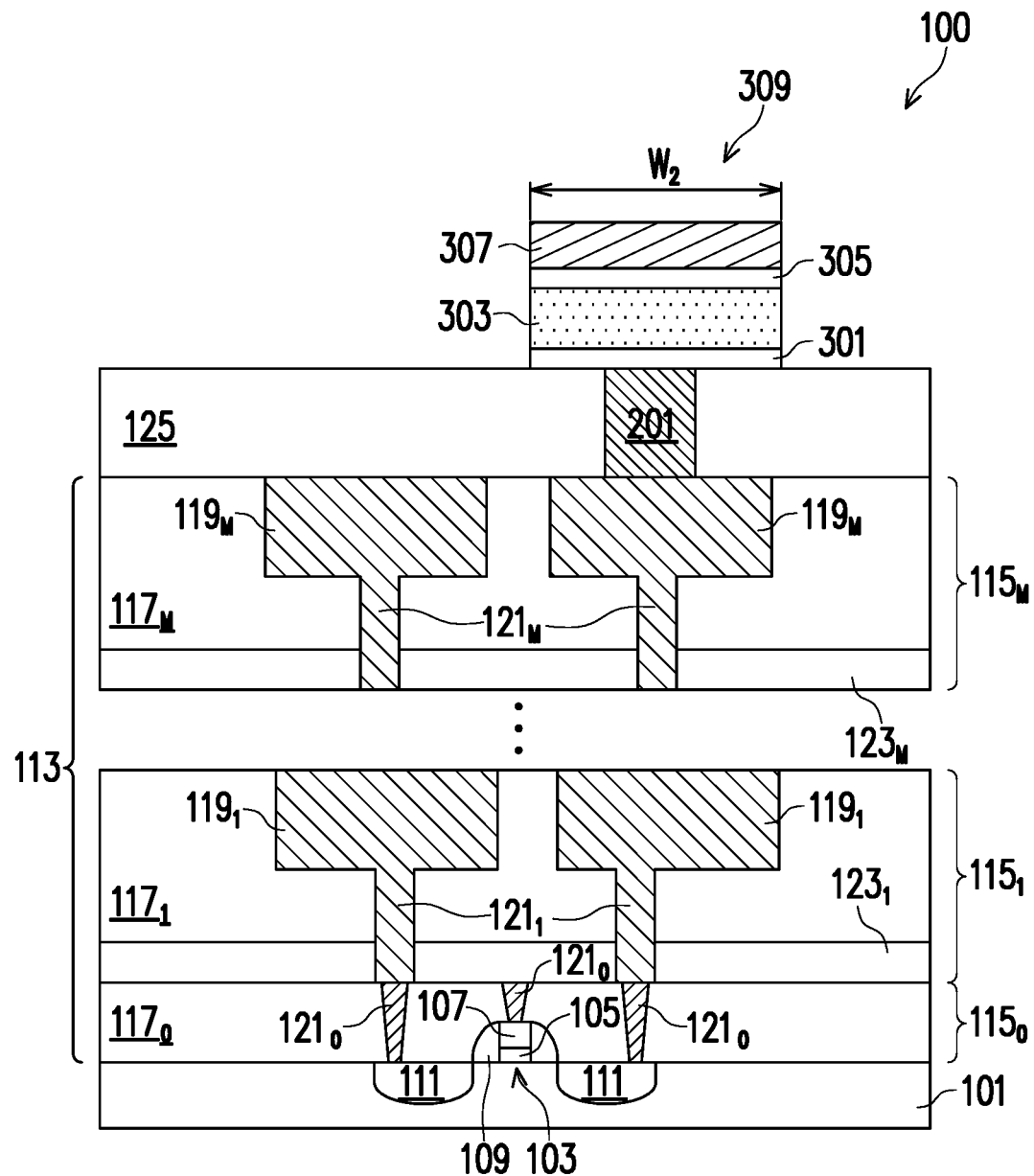

Referring to FIG. 3, the buffer material 203, the phase-change material 205, the buffer material 207 and the conductive material 209 (see FIG. 2) are patterned, such that the conductive layer 201 and remaining portions of the buffer material 203, the phase-change material 205, the buffer material 207 and the conductive material 209 form a PCRAM structure 309. In some embodiments, the buffer material 203, the phase-change material 205, the buffer material 207 and the conductive material 209 may be patterned using suitable photolithography and etching methods. In some embodiments, a single mask may be used to pattern the buffer material 203, the phase-change material 205, the buffer material 207 and the conductive material 209. The suitable etching processes may comprise one or more dry etching processes, one or more wet etching processes, a combination thereof, or the like. In some embodiments, the buffer material 203, the phase-change material 205, the buffer material 207 and the conductive material 209 are patterned using a single etch process, which may be a physical etch process or a chemical etch process. In other embodiments, the buffer material 203, the phase-change material 205, the buffer material 207 and the conductive material 209 are patterned using two different etch processes, with the first etch process patterning the conductive material 209 and the second etch process patterning the buffer material 203, the phase-change material 205 and the buffer material 207. In some embodiments, the first etch process may be a chemical etch process and the second etch process may be a physical etch process. By using the physical etch process, etch damage of the phase-change material 205 is reduced or avoided. In other embodiments, the first etch process may be a first chemical etch process and the second etch process may be a second chemical etch process. The first chemical etch process may be performed using Cl-containing etchants. The second chemical etch process may be performed using suitable etchants without including Cl-containing etchants. By not using Cl-containing etchants in the second chemical etch, etch damage of the phase-change material 205 is reduced or avoided.

In some embodiments, a remaining portion of the buffer material 203 forms a buffer layer 301, a remaining portion of the phase-change material 205 forms a phase-change layer 303, a remaining portion of the buffer material 207 forms a buffer layer 305, and a remaining portion of the conductive material 209 forms a conductive layer 307, such that the PCRAM structure 309 comprises the conductive layer 201, the buffer layer 301 over the conductive layer 201, the phase-change layer 303 over the buffer layer 301, the buffer layer 305 over the phase-change layer 303, and the conductive layer 307 over the buffer layer 305. The conductive layer 307 may also be referred to as a top electrode. In some embodiments, each of the buffer layer 301, the phase-change layer 303, the buffer layer 305, and the conductive layer 307 has a width $W_2$ between about 5 nm and about 200 nm. In some embodiments, the width of the conductive layer 201 is less than the width $W_2$.

Figure 4:
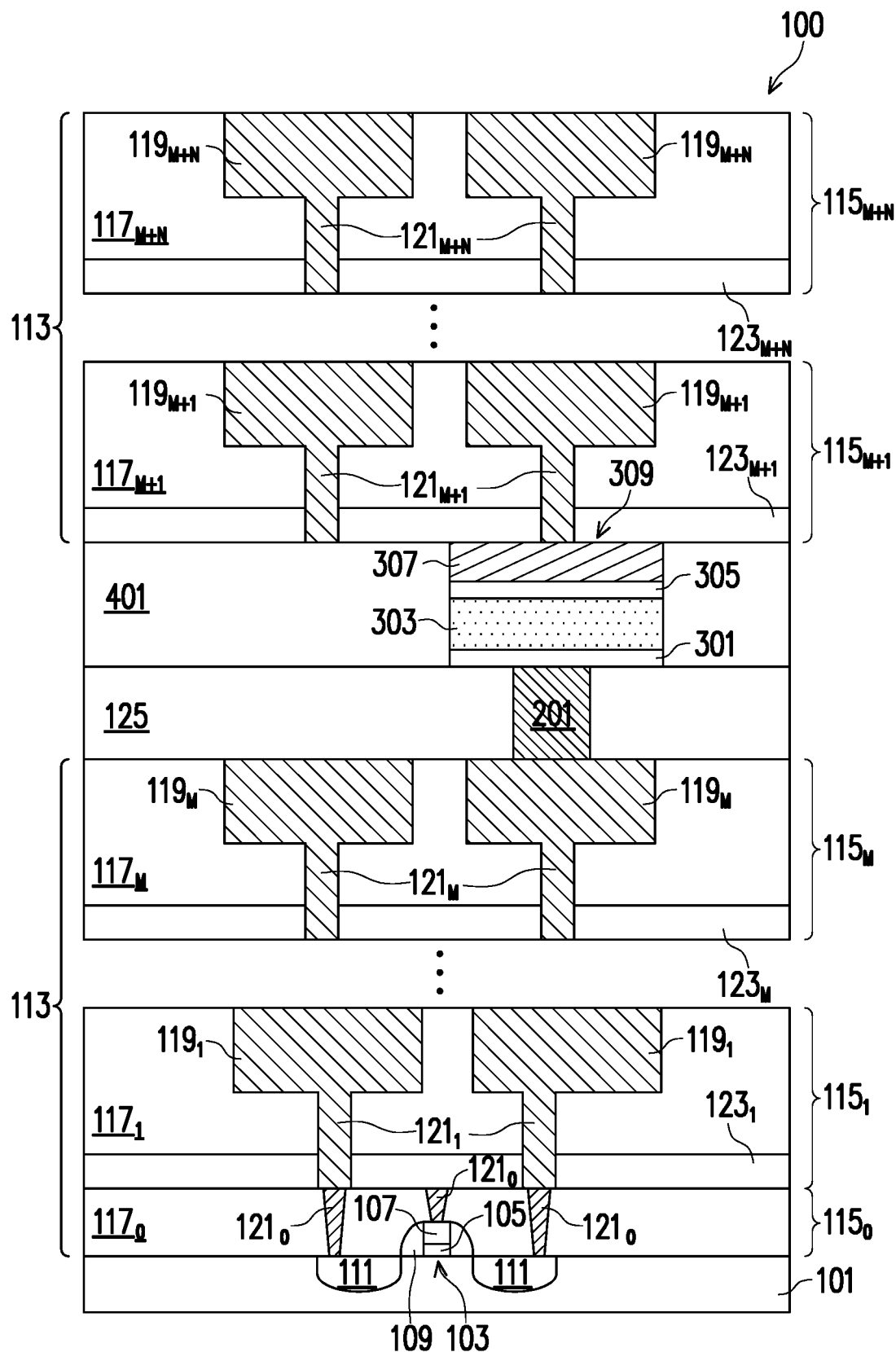

Referring to FIG. 4, a dielectric layer 401 is formed over the dielectric layer 125 and surrounding the PCRAM structure 309. In some embodiments, the dielectric layer 401 may be formed using similar material and methods as the dielectric layer 125 described above with reference to FIG. 1 and the description is not repeated herein. In some embodiments, the dielectric layer 401 is formed by depositing a suitable dielectric material over the dielectric layer 125 and the PCRAM structure 309 and performing a planarization process on the dielectric material to remove portions of the dielectric material extending above a topmost surface of the PCRAM structure 309. The planarization process may comprise a CMP process, an etching process, a grinding process, a combination thereof, or the like. After performing the planarization process, a topmost surface of the dielectric layer 401 is substantially coplanar or level with the topmost surface of the PCRAM structure 309 within process variations of the planarization process.

Subsequently, additional metallization layers $115_{M+1}$ to $115_{M+N}$ are formed over the dielectric layer 401 and the PCRAM structure 309, with the metallization layer $115_{M+N}$ being the last metallization layer of the interconnect structure 113. In some embodiments, the dielectric layers $117_{M+X}$ (with X=1, . . . , N) may be formed using similar materials and methods as the dielectric layers $117_0$ to $117_M$ described above with reference to FIG. 1, and the description is not repeated herein. In some embodiments, the ESLs $123_{M+X}$ (with X=1, . . . , N) may be formed using similar materials and methods as the ESLs $123_1$ to $123_M$ described above with reference to FIG. 1, and the description is not repeated herein. In some embodiments, the conductive lines $119_{M+X}$ (with X=1, . . . , N) may be formed using similar materials and methods as the conductive lines $119_1$ to $119_M$ described above with reference to FIG. 1, and the description is not repeated herein. In some embodiments, the conductive vias $121_{M+X}$ (with X=1, . . . , N) may be formed using similar materials and methods as the conductive vias $121_1$ to $121_M$ described above with reference to FIG. 1, and the description is not repeated herein. In some embodiments, N is equal to 1. In other embodiments, N is greater than 1.

Referring further to FIG. 4, by forming the buffer layer 301 between the conductive layer 201 and the phase-change layer 303, metal diffusion from the conductive layer 201 into the phase-change layer 303 may be reduced or avoided. In some embodiments where the conductive layer 201 comprises TiN, the buffer layer 301 prevents Ti atoms from diffusing into the phase-change layer 303. By forming the buffer layer 305 between the conductive layer 307 and the phase-change layer 303, metal diffusion from the conductive layer 307 into the phase-change layer 303 may be reduced or avoided. In some embodiments where the conductive layer 307 comprises TiN, the buffer layer 305 prevents Ti atoms from diffusing into the phase-change layer 303. In some embodiments, by avoiding the metal contaminants in the phase-change layer 303, read/write cycling endurance of the PCRAM structure 309 may be improved. In some embodiments, the conductive layers 201 and 307 comprise TiN and the buffer layers 301 and 305 comprise amorphous carbon. In other embodiments, the conductive layer 201 comprises Ru, the conductive layer 307 comprises TiN, and the buffer layers 301 and 305 comprise amorphous carbon. In yet other embodiments, the conductive layer 201 comprises TiN, the conductive layer 307 comprises Ru, and the buffer layers 301 and 305 comprise amorphous carbon.

Figure 5:
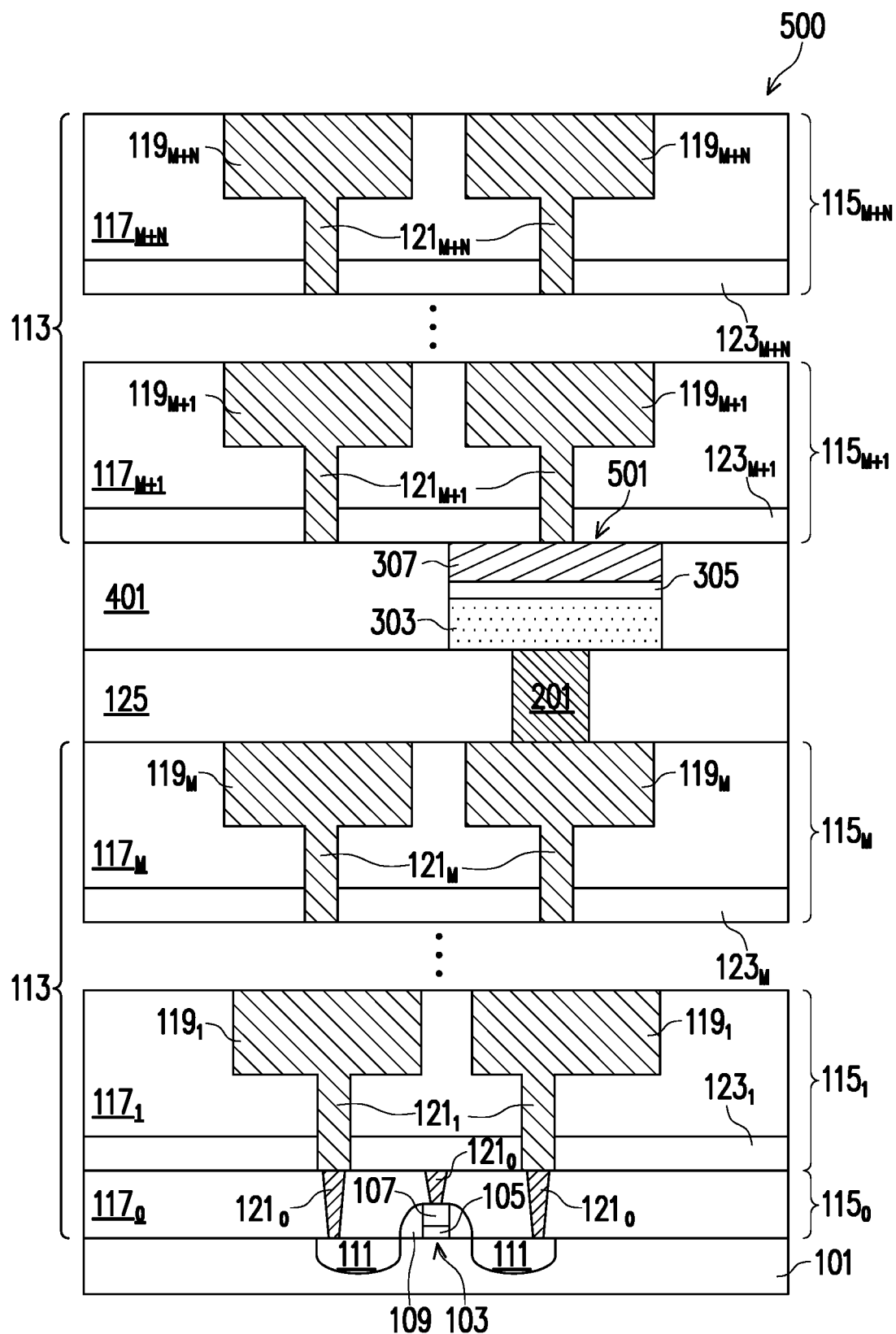
FIG. 5 illustrates a cross-sectional view of a PCRAM cell in accordance with some embodiments.

FIG. 5 illustrates a cross-sectional view of a PCRAM cell 500 in accordance with some embodiments. In some embodiments, the PCRAM cell 500 may be similar to the PCRAM cell 100 illustrated in FIG. 4, with similar features of the PCRAM cell 500 and the PCRAM cell 100 being labeled with similar numerical references and descriptions of the similar features are not repeated herein. In some embodiments, the PCRAM cell 500 may be formed using process steps described above with reference to FIG. 1-4, but omitting the formation of the buffer material 203. In distinction with the PCRAM structure 309 of the PCRAM cell 100 (see FIG. 1), the buffer layer 301 is omitted in the PCRAM structure 501 of the PCRAM cell 500 and the PCRAM structure 501 comprises the conductive layer 201 in physical contact with phase-change layer 303. By forming the buffer layer 305 between the conductive layer 307 and the phase-change layer 303, metal diffusion from the conductive layer 307 into the phase-change layer 303 may be reduced or avoided. In some embodiments, the metal diffusion from the conductive layer 201 into the phase-change layer 303 may be reduced or avoided by forming the conductive layer 201 with a conductive material comprising metal elements with reduced diffusion coefficients. In such embodiments, the conductive layer 201 may comprise Ru, W, WN, C, a combination thereof, a multilayer thereof, or the like.

Figure 6:
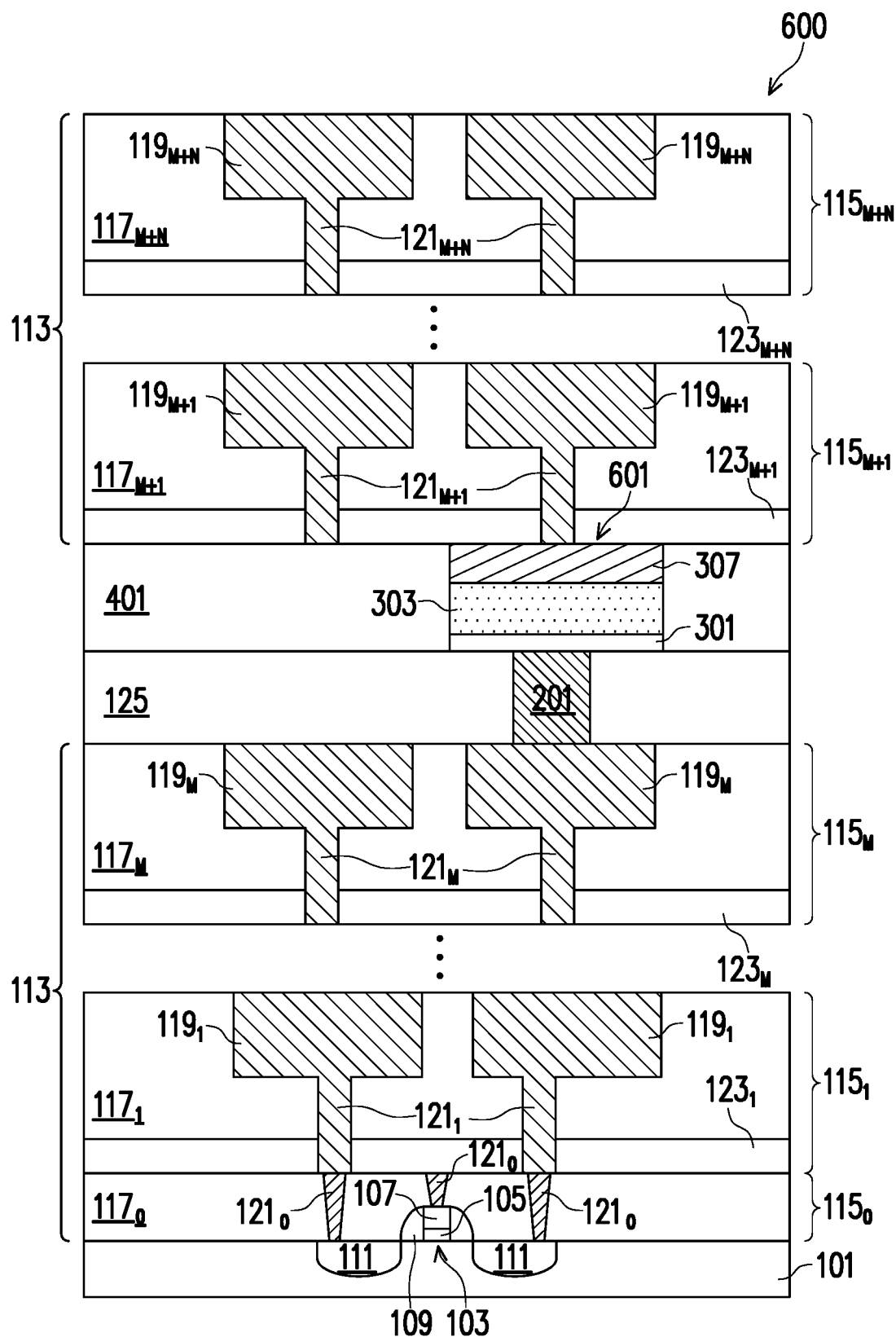
FIG. 6 illustrates a cross-sectional view of a PCRAM cell in accordance with some embodiments.

FIG. 6 illustrates a cross-sectional view of a PCRAM cell 600 in accordance with some embodiments. In some embodiments, the PCRAM cell 600 may be similar to the PCRAM cell 100 illustrated in FIG. 4, with similar features of the PCRAM cell 600 and the PCRAM cell 100 being labeled with similar numerical references and descriptions of the similar features are not repeated herein. In some embodiments, the PCRAM cell 600 may be formed using process steps described above with reference to FIG. 1-4, but omitting the formation of the buffer material 207. In distinction with the PCRAM structure 309 of the PCRAM cell 100 (see FIG. 1), the buffer layer 305 is omitted in the PCRAM structure 601 of the PCRAM cell 600 and the PCRAM structure 601 comprises the conductive layer 307 in physical contact with the phase-change layer 303. By forming the buffer layer 301 between the conductive layer 201 and the phase-change layer 303, metal diffusion from the conductive layer 201 into the phase-change layer 303 may be reduced or avoided. In some embodiments, the metal diffusion from the conductive layer 307 into the phase-change layer 303 may be reduced or avoided by forming the conductive layer 307 with a conductive material comprising metal elements with reduced diffusion coefficients. In such embodiments, the conductive layer 307 may comprise Ru, W, WN, C, a combination thereof, a multilayer thereof, or the like.

Figure 7:
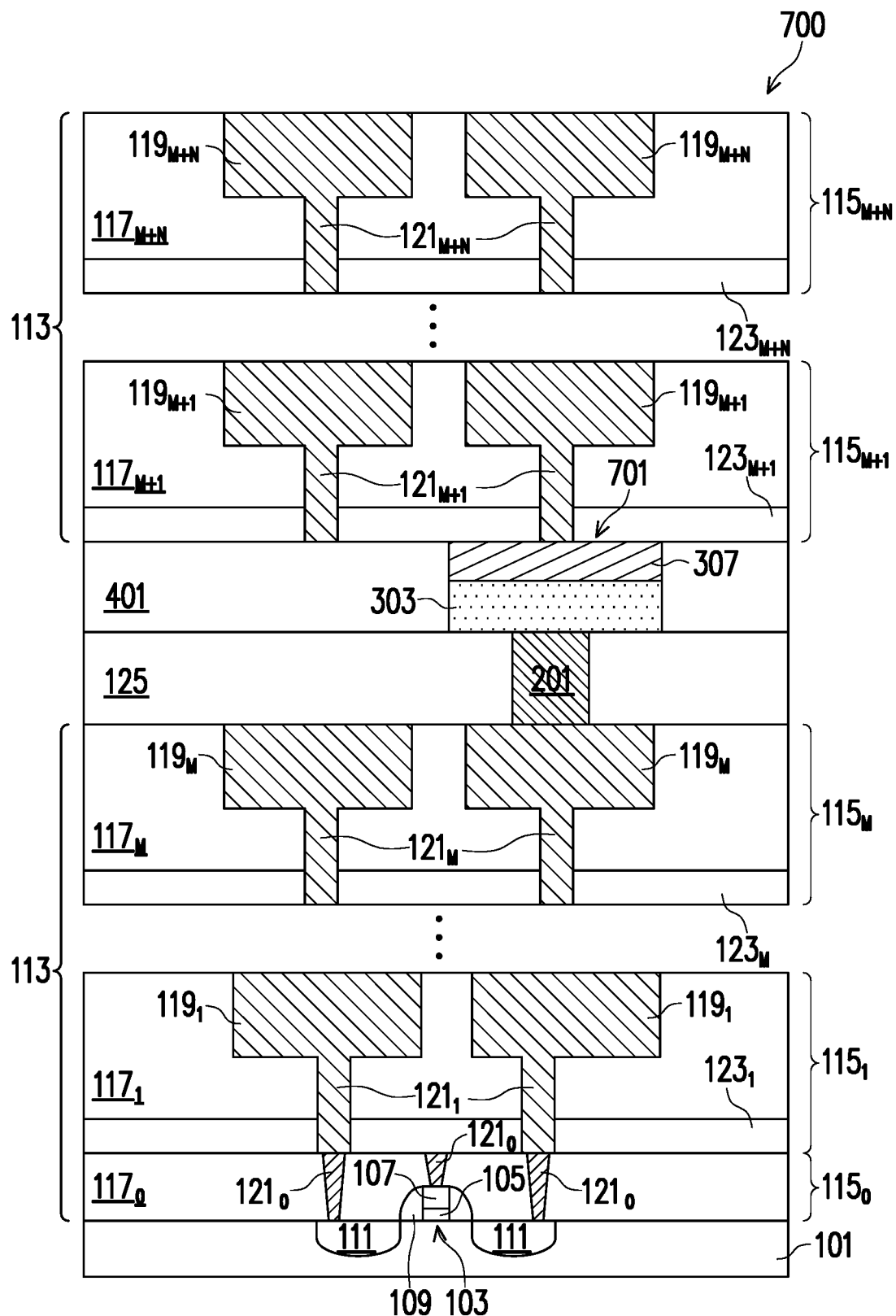
FIG. 7 illustrates a cross-sectional view of a PCRAM cell in accordance with some embodiments.

FIG. 7 illustrates a cross-sectional view of a PCRAM cell 700 in accordance with some embodiments. In some embodiments, the PCRAM cell 700 may be similar to the PCRAM cell 100 illustrated in FIG. 4, with similar features of the PCRAM cell 700 and the PCRAM cell 100 being labeled with similar numerical references and descriptions of the similar features are not repeated herein. In some embodiments, the PCRAM cell 700 may be formed using process steps described above with reference to FIG. 1-4, but omitting the formation of the buffer materials 203 and 207. In distinction with the PCRAM structure 309 of the PCRAM cell 100 (see FIG. 1), the buffer layers 301 and 305 are omitted in the PCRAM structure 701 of the PCRAM cell 700 and the PCRAM structure 701 comprises the conductive layers 201 and 307 in physical contact with the phase-change layer 303. In some embodiments, the metal diffusion from the conductive layers 201 and 307 into the phase-change layer 303 may be reduced or avoided by forming the conductive layers 201 and 307 with a conductive material comprising metal elements with reduced diffusion coefficients. In some embodiments, the conductive layer 201 may comprise Ru, W, WN, C, a combination thereof, a multilayer thereof, or the like. In other embodiments, the conductive layer 307 may comprise Ru, W, WN, C, a combination thereof, a multilayer thereof, or the like. In yet other embodiments, each of the conductive layers 201 and 307 may comprise Ru, W, WN, C, a combination thereof, a multilayer thereof, or the like.

Figure 8:
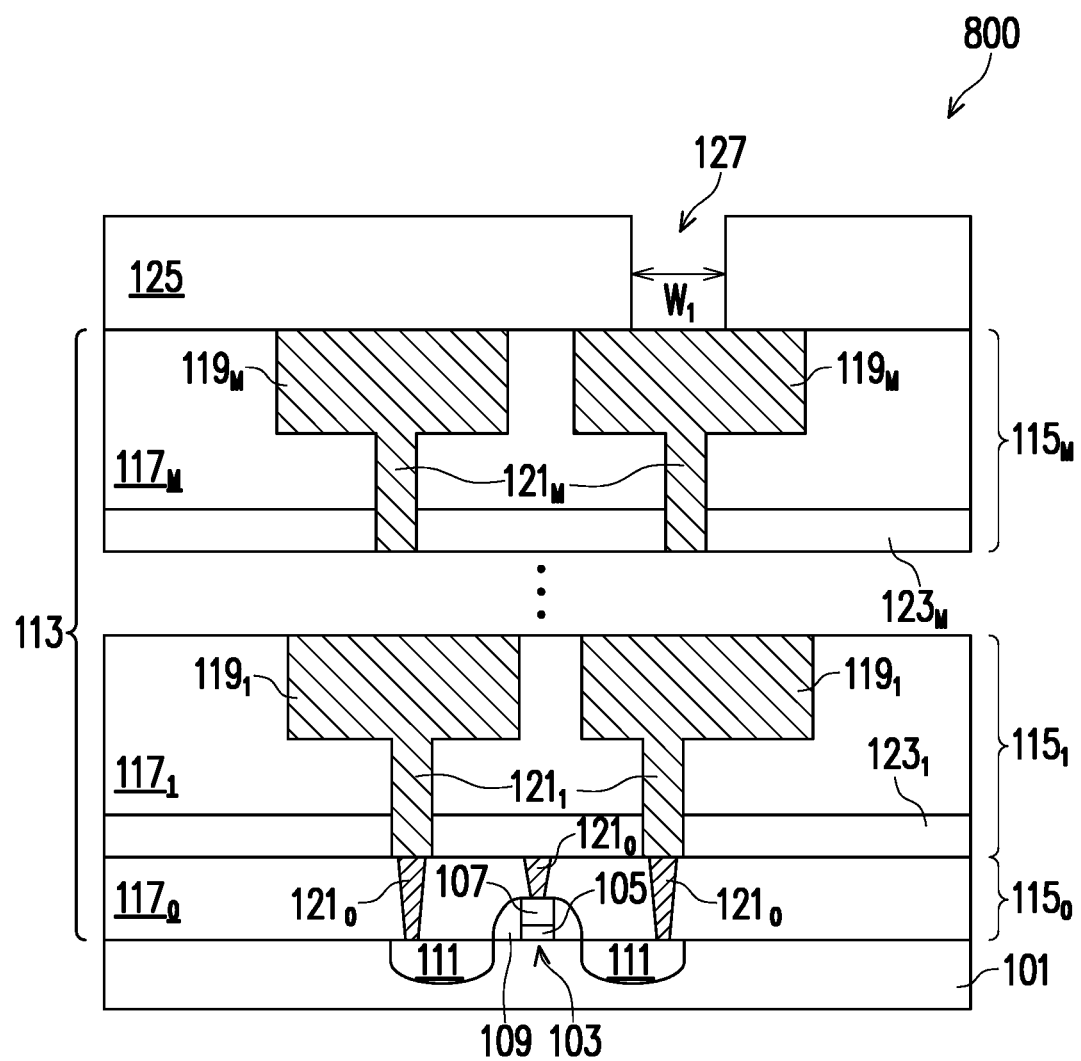
FIGS. 8-13 illustrate cross-sectional views of intermediate stages in the manufacturing of a PCRAM cell in accordance with some embodiments.

FIGS. 8-13 illustrate cross-sectional views of intermediate stages in the manufacturing of a PCRAM cell 800 in accordance with some embodiments. In some embodiments, the structure illustrated in FIG. 8 is similar to the structure illustrated in FIG. 1, with similar features being labeled with similar numerical references and descriptions of the similar features are not repeated herein. In some embodiments, the structure illustrated in FIG. 8 may be formed using process steps described above with reference to FIG. 1 and the description is not repeated herein.

Figure 9:
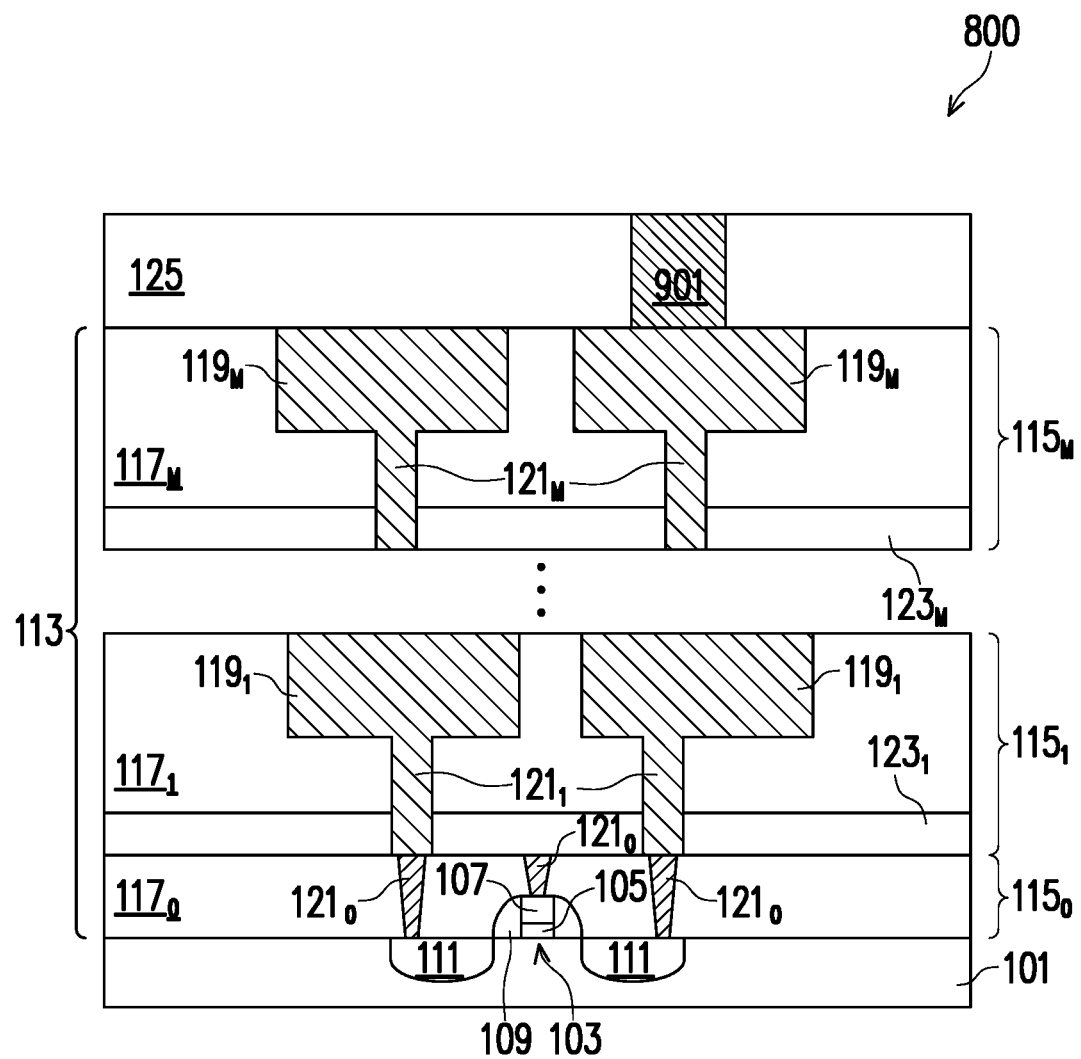

Referring to FIG. 9, a conductive layer 901 is formed in the opening 127 (see FIG. 8). In some embodiments, the conductive layer 901 may be formed using similar materials and methods as the conductive layer 201 described above with reference to FIG. 2 and the description is not repeated herein. The conductive layer 901 may be also referred to as a bottom electrode.

Figure 10:
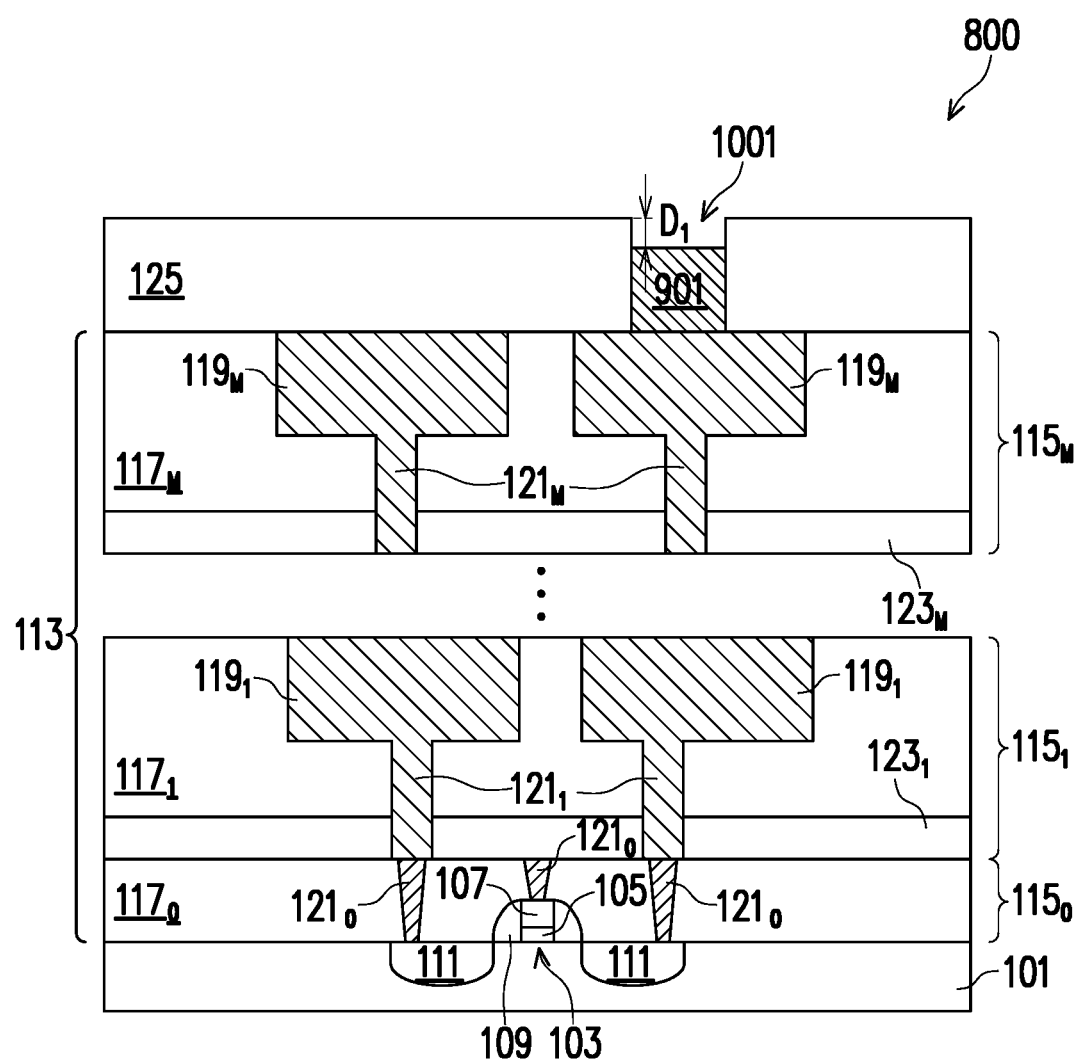

Referring to FIG. 10, the conductive layer 901 is recessed below a topmost surface of the dielectric layer 125 to a depth $D_1$ to form a recess 1001. In some embodiments, the conductive layer 901 may be recessed using a suitable etching process. In some embodiments, the suitable etching process may be a chemical etch process. In some embodiments, the depth $D_1$ is between about 5 nm and about 30 nm.

Figure 11:
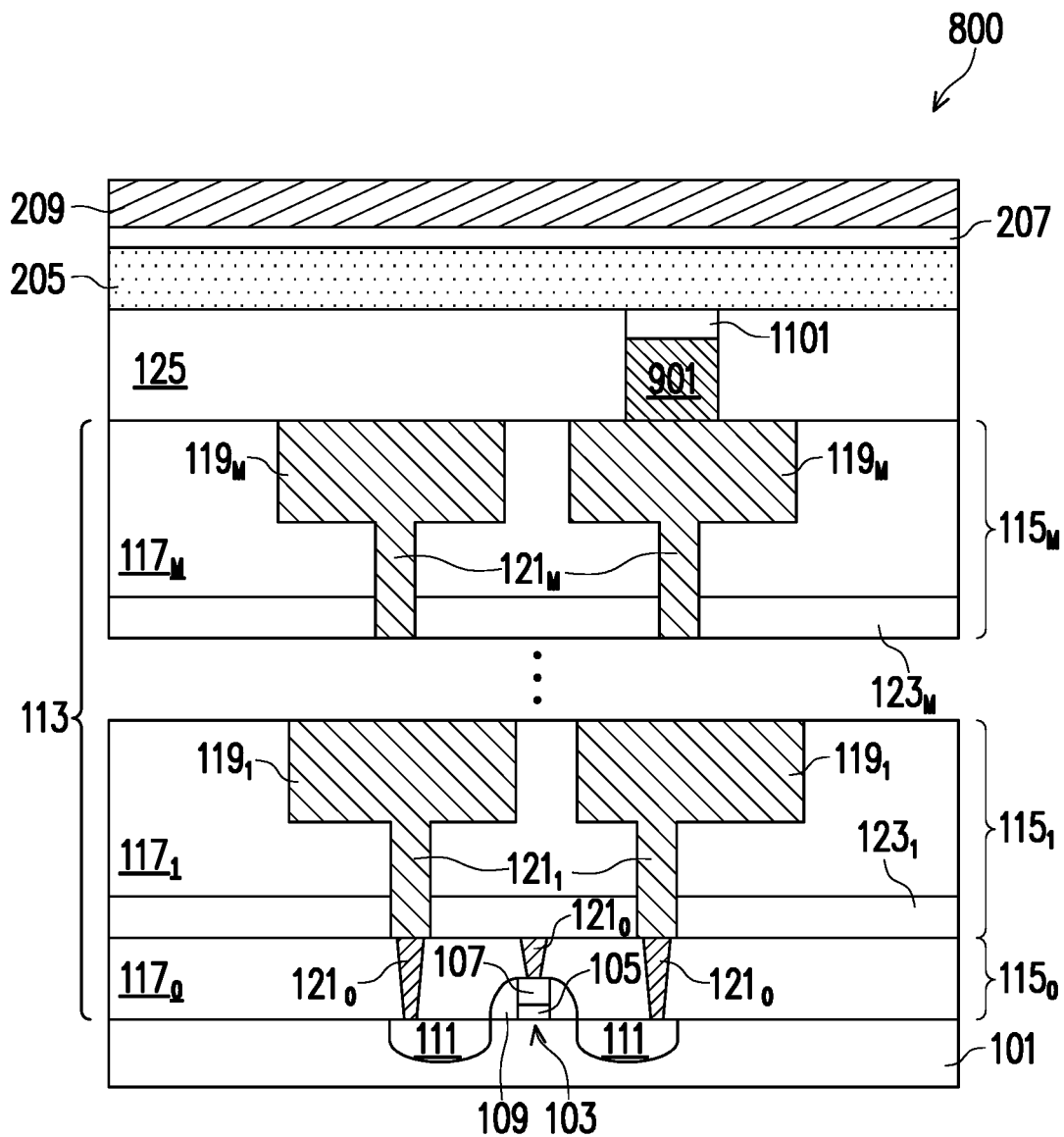

Referring to FIG. 11, a buffer layer 1101 is formed over the conductive layer 901 in the recess 1001 (see FIG. 10). In some embodiments, a buffer material is deposited in the recess 1001 and may overfill the recess 1001. In some embodiments, a planarization process, such as a CMP process, an etching process, a grinding process, a combination thereof, or the like, is performed on the buffer material to remove excess portions of the buffer material overfilling the recess 1001. In such embodiments, a topmost surface of the buffer layer 1101 is substantially coplanar or level with a topmost surface of the dielectric layer 125 within process variations of the planarization process. In some embodiments, the buffer material of the buffer layer 1101 may be formed using similar materials and methods as the buffer material 203 described above with reference to FIG. 2 and the description is not repeated herein. In some embodiments, the buffer layer 1101 has a thickness between about 1 nm and about 10 nm. In some embodiments, the buffer layer 1101 has a width between about 5 nm and about 40 nm. In some embodiments, the buffer layer 1101 and the conductive layer 901 have a same width.

In some embodiments, after forming the buffer layer 1101, a phase-change material 205 is blanket deposited over the buffer layer 1101 and the dielectric layer 125, a buffer material 207 is blanket deposited over the phase-change material 205, and a conductive material 209 is blanket deposited over the buffer material 207. In some embodiments, the phase-change material 205, the buffer material 207, and the conductive material 209 may be formed as described above with reference to FIG. 2 and the description is not repeated herein. In some embodiments, the buffer layer 1101 and the buffer material 207 comprise a same material. In other embodiments, the buffer layer 1101 and the buffer material 207 comprise different materials. In some embodiments, the conductive layer 901 and the conductive material 209 may comprise a same material. In other embodiments, the conductive layer 901 and the conductive material 209 may comprise different materials.

Figure 12:
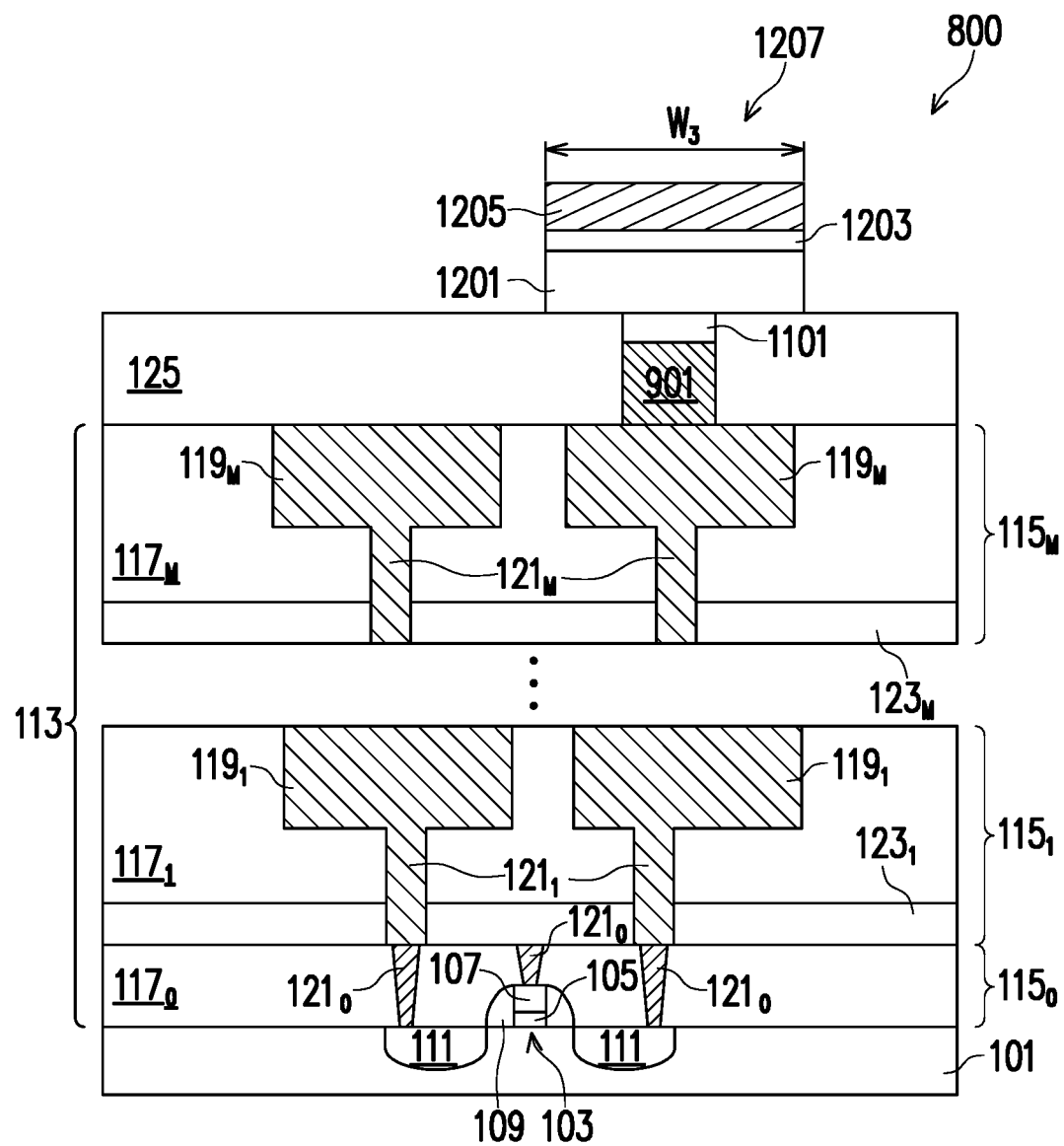

Referring to FIG. 12, the phase-change material 205, the buffer material 207 and the conductive material 209 (see FIG. 11) are patterned, such that the conductive layer 901, the buffer layer 1101 and remaining portions of the phase-change material 205, the buffer material 207 and the conductive material 209 form a PCRAM structure 1207. In some embodiments, the phase-change material 205, the buffer material 207 and the conductive material 209 may be patterned using suitable photolithography and etching methods. In some embodiments, a single mask may be used to pattern the phase-change material 205, the buffer material 207 and the conductive material 209. The suitable etching processes may comprise one or more dry etching processes, one or more wet etching processes, a combination thereof, or the like. In some embodiments, the phase-change material 205, the buffer material 207 and the conductive material 209 are patterned using a single etch process, which may be a physical etch process or a chemical etch process. In other embodiments, the phase-change material 205, the buffer material 207 and the conductive material 209 are patterned using two different etch processes, with the first etch process patterning the conductive material 209 and the second etch process patterning the phase-change material 205 and the buffer material 207. In some embodiments, the first etch process may be a chemical etch process and the second etch process may be a physical etch process. By using the physical etch process, etch damage of the phase-change material 205 is reduced or avoided. In other embodiments, the first etch process may be a first chemical etch process and the second etch process may be a second chemical etch process. The first chemical etch process may be performed using Cl-containing etchants. The second chemical etch process may be performed using suitable etchants without including Cl-containing etchants. By not using Cl-containing etchants in the second chemical etch, etch damage of the phase-change material 205 is reduced or avoided.

In some embodiments, a remaining portion of the phase-change material 205 forms a phase-change layer 1201, a remaining portion of the buffer material 207 forms a buffer layer 1203, and a remaining portion of the conductive material 209 forms a conductive layer 1205, such that the PCRAM structure 1207 comprises the conductive layer 901, the buffer layer 1101 over the conductive layer 901, the phase-change layer 1201 over the buffer layer 1101, the buffer layer 1203 over the phase-change layer 1201, and the conductive layer 1205 over the buffer layer 1203. The conductive layer 1205 may also be referred to as a top electrode. In some embodiments, each of the phase-change layer 1201, the buffer layer 1203, and the conductive layer 1205 has a width $W_3$ between about 5 nm and about 200 nm. In some embodiments, the width of the conductive layer 901 is less than the width $W_3$. In some embodiments, the width of the buffer layer 1101 is less than the width $W_3$.

Figure 13:
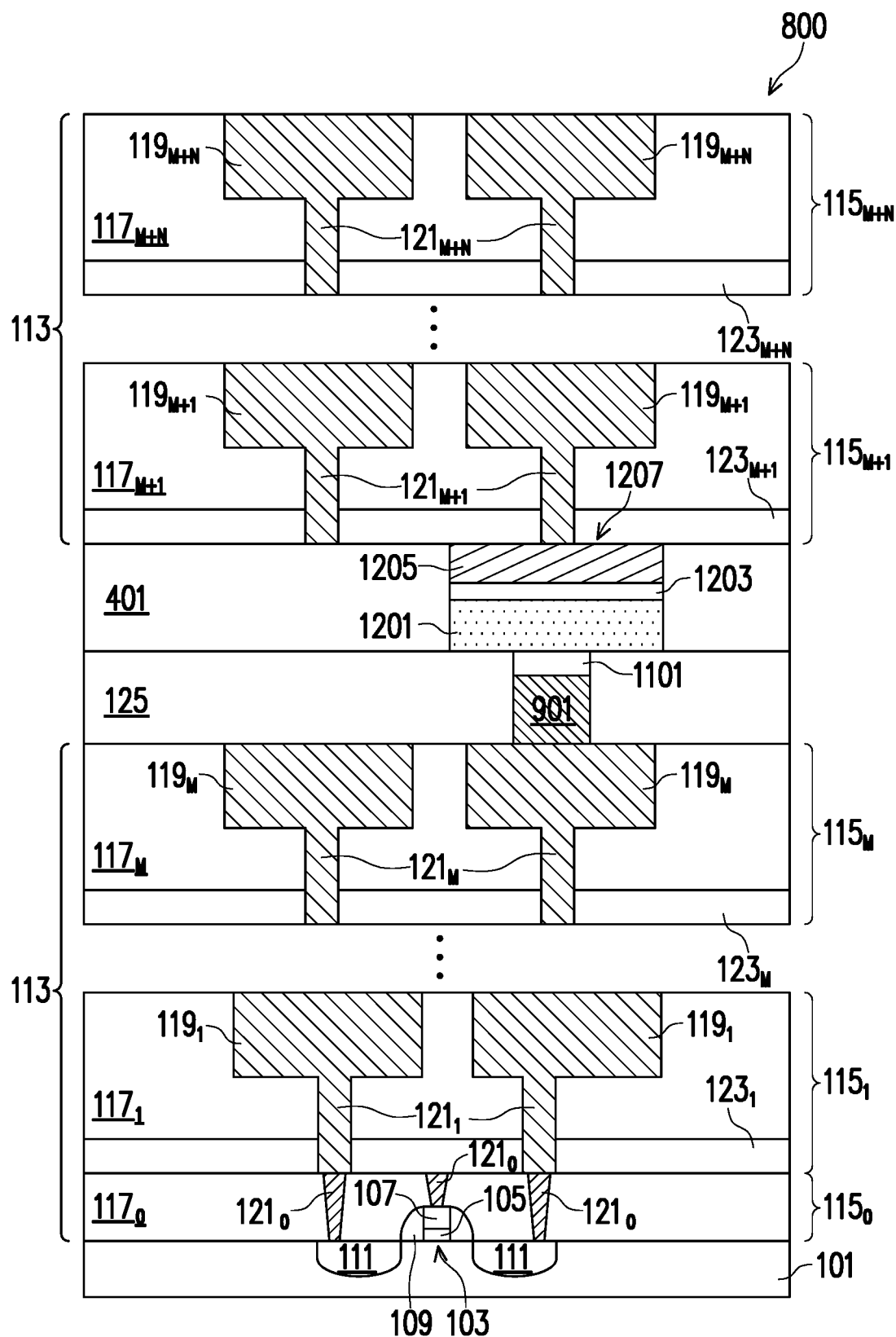

Referring to FIG. 13, a dielectric layer 401 is formed over the dielectric layer 125 and surrounding the PCRAM structure 1207. In some embodiments, the dielectric layer 401 is formed using process steps described above with reference to FIG. 4 and the description is not repeated herein. Subsequently, additional metallization layers $115_{M+1}$ to $115_{M+N}$ are formed over the dielectric layer 401 and the PCRAM structure 1207, with the metallization layer $115_{M+N}$ being the last metallization layer of the interconnect structure 113. In some embodiments, the metallization layers $115_{M+1}$ to $115_{M+N}$ are formed using process steps described above with reference to FIG. 4 and the description is not repeated herein.

Referring further to FIG. 13, by forming the buffer layer 1101 between the conductive layer 901 and the phase-change layer 1201, metal diffusion from the conductive layer 901 into the phase-change layer 1201 may be reduced or avoided. In some embodiments where the conductive layer 901 comprises TiN, the buffer layer 1101 prevents Ti atoms from diffusing into the phase-change layer 1201. By forming the buffer layer 1203 between the conductive layer 1205 and the phase-change layer 1201, metal diffusion from the conductive layer 1205 into the phase-change layer 1201 may be reduced or avoided. In some embodiments where the conductive layer 1205 comprises TiN, the buffer layer 1203 prevents Ti atoms from diffusing into the phase-change layer 1201. In some embodiments, by avoiding the metal contaminants in the phase-change layer 1201, read/write cycling endurance of the PCRAM structure 1207 may be improved. In some embodiments, the conductive layers 901 and 1205 comprise TiN and the buffer layers 1101 and 1203 comprise amorphous carbon. In other embodiments, the conductive layer 901 comprises Ru, the conductive layer 1205 comprises TiN, and the buffer layers 1101 and 1203 comprise amorphous carbon. In yet other embodiments, the conductive layer 901 comprises TiN, the conductive layer 1205 comprises Ru, and the buffer layers 1101 and 1203 comprise amorphous carbon.

Figure 14:
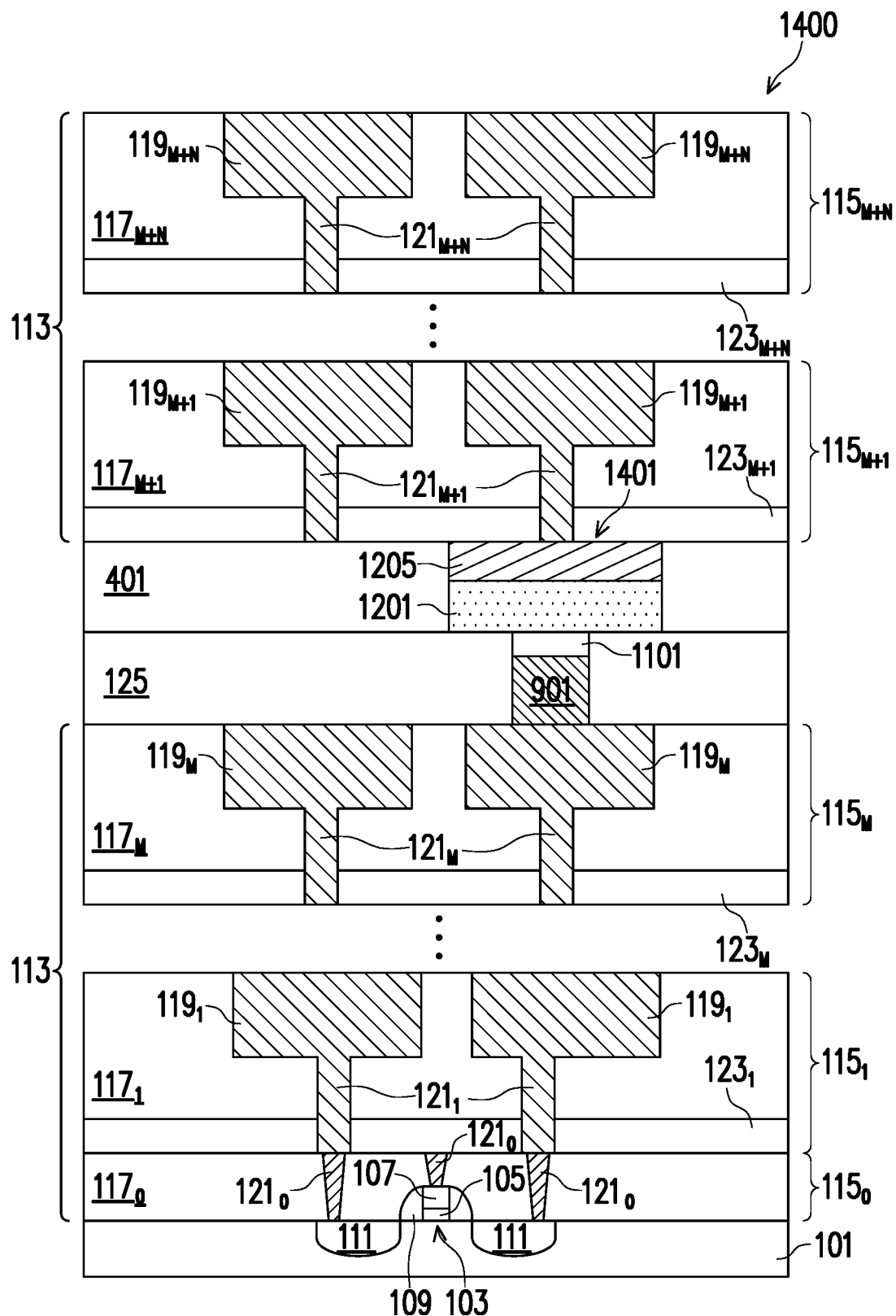
FIG. 14 illustrates a cross-sectional view of a PCRAM cell in accordance with some embodiments.

FIG. 14 illustrates a cross-sectional view of a PCRAM cell 1400 in accordance with some embodiments. In some embodiments, the PCRAM cell 1400 may be similar to the PCRAM cell 800 illustrated in FIG. 13, with similar features of the PCRAM cell 1400 and the PCRAM cell 800 being labeled with similar numerical references and descriptions of the similar features are not repeated herein. In some embodiments, the PCRAM cell 1400 may be formed using process steps described above with reference to FIG. 8-13, but omitting the formation of the buffer material 207. In distinction with the PCRAM structure 1207 of the PCRAM cell 800 (see FIG. 13), the buffer layer 1203 is omitted in the PCRAM structure 1401 of the PCRAM cell 1400 and the PCRAM structure 1401 comprises the conductive layer 1205 in physical contact with the phase-change layer 1201. By forming the buffer layer 1101 between the conductive layer 901 and the phase-change layer 1201, metal diffusion from the conductive layer 901 into the phase-change layer 1201 may be reduced or avoided. In some embodiments, the metal diffusion from the conductive layer 1205 into the phase-change layer 1201 may be reduced or avoided by forming the conductive layer 1205 with a conductive material comprising metal elements with reduced diffusion coefficients. In such embodiments, the conductive layer 1205 may comprise Ru, W, WN, C, a combination thereof, a multilayer thereof, or the like.

Figure 15:
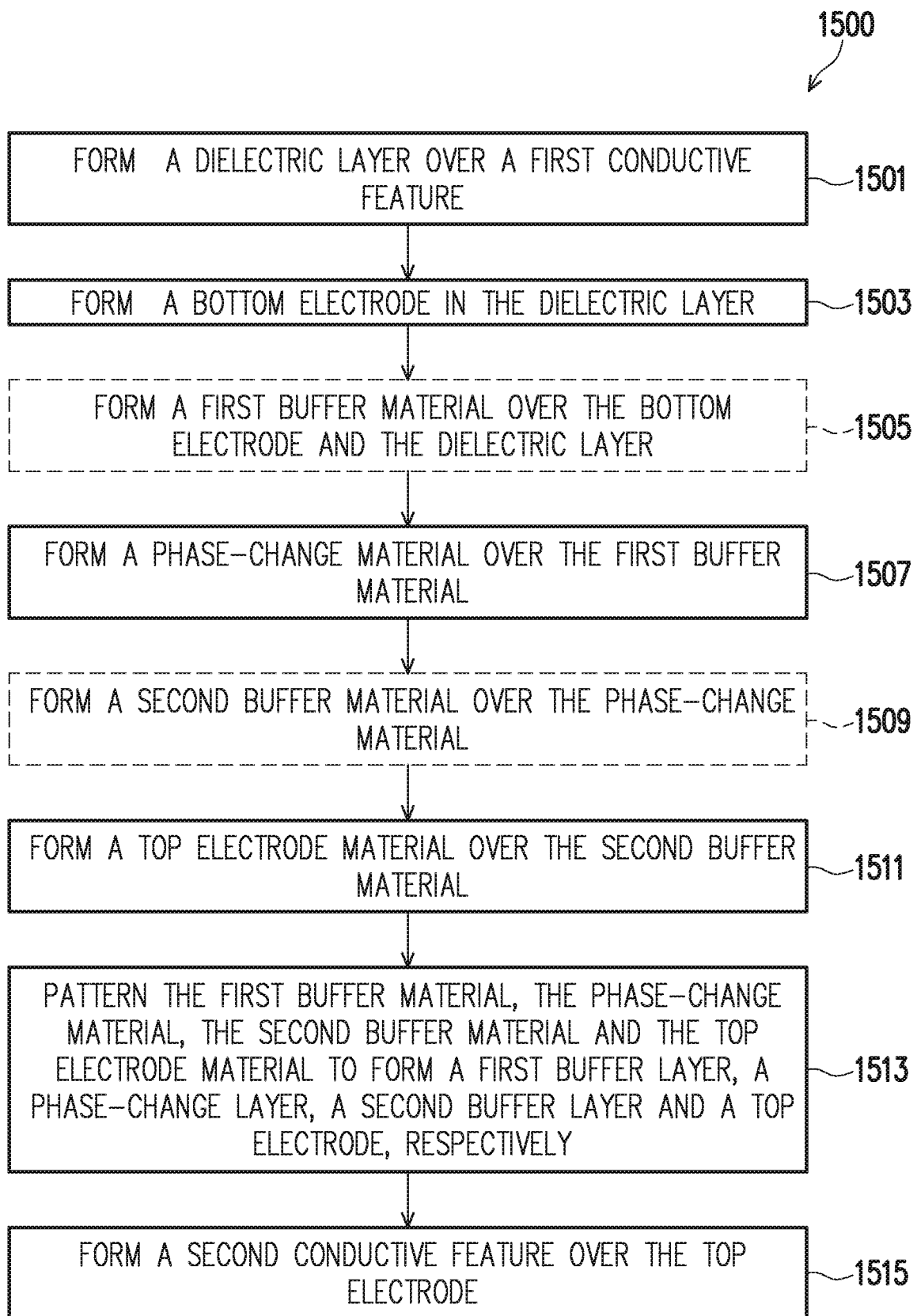
FIG. 15 is a flow diagram illustrating a method of forming a PCRAM cell in accordance with some embodiments.

FIG. 15 is a flow diagram illustrating a method 1500 of forming a PCRAM cell in accordance with some embodiments. The method 1500 starts with step 1501, where a dielectric layer (such as the dielectric layer 125 illustrated in FIG. 1) is formed over a first conductive feature (such as the conductive line $119_M$ illustrated in FIG. 1) as described above with reference to FIG. 1. In step 1503, a bottom electrode (such as the conductive layer 201 illustrated in FIG. 2) is formed in the dielectric layer as described above with reference to FIGS. 1 and 2. In step 1505, a first buffer material (such as the buffer material 203 illustrated in FIG. 2) is formed over the bottom electrode and the dielectric layer as described above with reference to FIG. 2. In step 1507, a phase-change material (such as the phase-change material 205 illustrated in FIG. 2) is formed over the first buffer material as described above with reference to FIG. 2. In step 1509, a second buffer material (such as the buffer material 207 illustrated in FIG. 2) is formed over the phase-change material as described above with reference to FIG. 2. In step 1511, a top electrode material (such as the conductive material 209 illustrated in FIG. 2) is formed over the second buffer material as described above with reference to FIG. 2. In step 1513, the first buffer material, the phase-change material, the second buffer material, and the top electrode material are patterned to form a first buffer layer (such as the buffer layer 301 illustrated in FIG. 3), a phase-change layer (such as the phase-change layer 303 illustrated in FIG. 3), a second buffer layer (such as the buffer layer 305 illustrated in FIG. 3), and a top electrode (such as the conductive layer 307 illustrated in FIG. 3), respectively, as described above with reference to FIG. 3. In step 1515, a second conductive feature (such as the conductive via $121_{M+1}$ illustrated in FIG. 4) is formed over the top electrode as described above with reference to FIG. 4. In some embodiments, step 1505 may be omitted. In other embodiments, step 1509 may be omitted. In yet other embodiments, steps 1505 and 1509 may be omitted.

Figure 16:
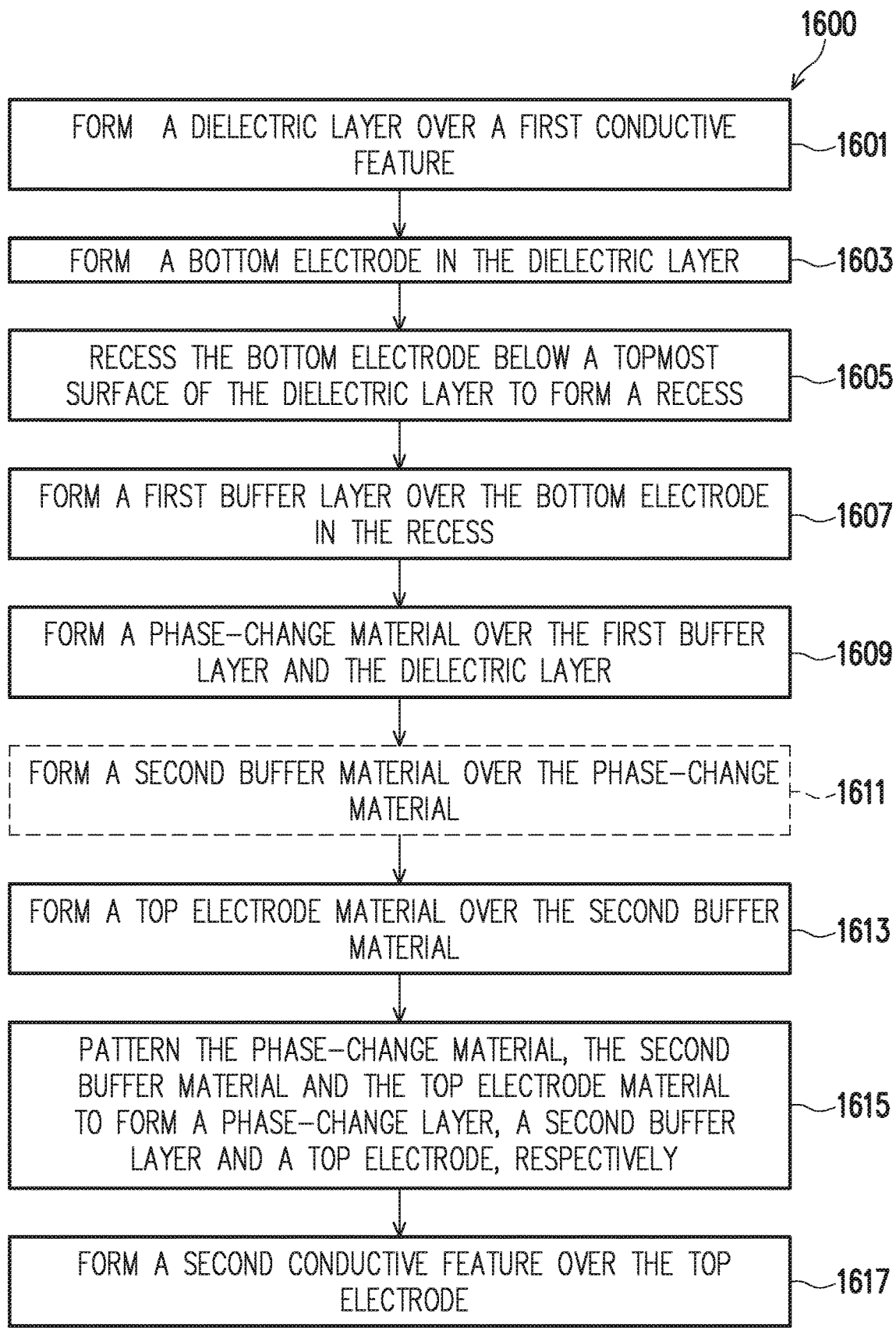
FIG. 16 is a flow diagram illustrating a method of forming a PCRAM cell in accordance with some embodiments.

FIG. 16 is a flow diagram illustrating a method 1600 of forming a PCRAM cell in accordance with some embodiments. The method 1600 starts with step 1601, where a dielectric layer (such as the dielectric layer 125 illustrated in FIG. 8) is formed over a first conductive feature (such as the conductive line $119_M$ illustrated in FIG. 8) as described above with reference to FIG. 8. In step 1603, a bottom electrode (such as the conductive layer 901 illustrated in FIG. 9) is formed in the dielectric layer as described above with reference to FIGS. 8 and 9. In step 1605, the bottom electrode is recessed below a topmost surface of the dielectric layer to form a recess (such as the recess 1001 illustrated in FIG. 10) as described above with reference to FIG. 10. In step 1607, a first buffer layer (such as the buffer layer 1101 illustrated in FIG. 11) is formed over the bottom electrode in the recess as described above with reference to FIG. 11. In step 1609, a phase-change material (such as the phase-change material 205 illustrated in FIG. 11) is formed over the first buffer layer and the dielectric layer as described above with reference to FIG. 11. In step 1611, a second buffer material (such as the buffer material 207 illustrated in FIG. 11) is formed over the phase-change material as described above with reference to FIG. 11. In step 1613, a top electrode material (such as the conductive material 209 illustrated in FIG. 11) is formed over the second buffer material as described above with reference to FIG. 11. In step 1615, the phase-change material, the second buffer material, and the top electrode material are patterned to form a phase-change layer (such as the phase-change layer 1201 illustrated in FIG. 12), a second buffer layer (such as the buffer layer 1203 illustrated in FIG. 12), and a top electrode (such as the conductive layer 1205 illustrated in FIG. 12), respectively, as described above with reference to FIG. 12. In step 1617, a second conductive feature (such as the conductive via $121_{M+1}$ illustrated in FIG. 13) is formed over the top electrode as described above with reference to FIG. 13. In some embodiments, step 1611 may be omitted.

In an embodiment, a device includes: a substrate; a first dielectric layer over the substrate; a bottom electrode extending through the first dielectric layer; a first buffer layer over the bottom electrode; a phase-change layer over the first buffer layer; a top electrode over the phase-change layer, wherein a width of the top electrode is greater than a width of the bottom electrode; and a second dielectric layer over the first dielectric layer, the second dielectric layer surrounding the phase-change layer and the top electrode.

In another embodiment, a device includes: a substrate; a first dielectric layer over the substrate; a conductive line in the first dielectric layer; a second dielectric layer over the conductive line and the first dielectric layer; a bottom electrode within the second dielectric layer, the bottom electrode being electrically connected to the conductive line, the bottom electrode having a first width; a first buffer layer over the bottom electrode, the first buffer layer having a second width; a phase-change layer over the first buffer layer, the phase-change layer having a third width greater than the first width; a top electrode over the phase-change layer, the top electrode having the third width; a third dielectric layer over the second dielectric layer, the third dielectric layer extending along sidewalls of the phase-change layer and sidewalls of the top electrode; a fourth dielectric layer over the third dielectric layer and the top electrode; and a conductive via within the fourth dielectric layer, the conductive via being electrically connected to the top electrode.

In yet another embodiment, a method includes: forming a first dielectric layer over a substrate; forming a first conductive feature in the first dielectric layer; forming a second dielectric layer over the first dielectric layer and the first conductive feature; forming an opening in the second dielectric layer, the opening exposing a topmost surface of the first conductive feature; filling the opening with a first conductive material to form a bottom electrode in the second dielectric layer; depositing a phase-change material over the second dielectric layer and the bottom electrode; depositing a first buffer material over the phase-change material; depositing a second conductive material over the first buffer material; performing a patterning process to remove a portion of the phase-change material, a portion of the first buffer material and a portion of the second conductive material and to expose a topmost surface of the second dielectric layer, a remaining portion of the phase-change material forming a phase-change layer, a remaining portion of the first buffer material forming a first buffer layer, a remaining portion of the second conductive material forming a top electrode; and forming a third dielectric layer over the second dielectric layer, the third dielectric layer surrounding the first buffer layer, the phase-change layer and the top electrode.

In yet another embodiment, a method includes: forming a first dielectric layer over a substrate; forming a first conductive feature in the first dielectric layer; forming a second dielectric layer over the first dielectric layer and the first conductive feature; forming an opening in the second dielectric layer, the opening exposing a topmost surface of the first conductive feature; filling the opening with a first conductive material to form a bottom electrode in the second dielectric layer; recessing the bottom electrode below a top surface of the second dielectric layer to form a recess; depositing a first buffer material in the recess to form a first buffer layer, a top surface of the first buffer layer being substantially level with the top surface of the second dielectric layer; depositing a phase-change material over the second dielectric layer and the first buffer layer; depositing a second conductive material over the phase-change material; performing a patterning process to remove a portion of the phase-change material and a portion of the second conductive material, and to expose the top surface of the second dielectric layer, where a remaining portion of the phase-change material forms a phase-change layer and a remaining portion of the second conductive material forms a top electrode; and forming a third dielectric layer over the second dielectric layer, the third dielectric layer surrounding the phase-change layer and the top electrode.

In yet another embodiment, a method includes: forming a first interconnect structure over a substrate; forming a first dielectric layer over the first interconnect structure; forming a bottom electrode within the first dielectric layer; forming a first buffer layer over the bottom electrode; forming a phase-change layer over the first buffer layer, the phase-change layer being in physical contact with a top surface of the first dielectric layer, where a width of the phase-change layer is greater than a width of the bottom electrode; forming a top electrode over the phase-change layer; and forming a second dielectric layer over the first dielectric layer, where the second dielectric layer is in physical contact with sidewalls of the phase-change layer and sidewalls of the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first dielectric layer over a substrate;
   forming a first conductive feature in the first dielectric layer;
   forming a second dielectric layer over the first dielectric layer and the first conductive feature;
   forming an opening in the second dielectric layer, the opening exposing a topmost surface of the first conductive feature;
   filling the opening with a first conductive material to form a bottom electrode in the second dielectric layer;
   depositing a phase-change material over the second dielectric layer and the bottom electrode;
   depositing a first buffer material over the phase-change material;
   depositing a second conductive material over the first buffer material;
   performing a patterning process to remove a portion of the phase-change material, a portion of the first buffer material and a portion of the second conductive material, and to expose a topmost surface of the second dielectric layer, wherein a remaining portion of the phase-change material forms a phase-change layer, a remaining portion of the first buffer material forms a first buffer layer, and a remaining portion of the second conductive material forms a top electrode; and
   forming a third dielectric layer over the second dielectric layer, the third dielectric layer surrounding the first buffer layer, the phase-change layer and the top electrode.

2. The method of claim 1, further comprising, before depositing the phase-change material, depositing a second buffer material over the second dielectric layer and the bottom electrode.

3. The method of claim 2, wherein performing the patterning process further comprises removing a portion of the second buffer material, a remaining portion of the second buffer material forming a second buffer layer, the second buffer layer and the first buffer layer having a same width.

4. The method of claim 1, further comprising recessing the bottom electrode below the topmost surface of the second dielectric layer to form a recess.

5. The method of claim 4, further comprising filling the recess with a second buffer material to form a second buffer layer in the recess, a width of the second buffer layer being less than a width of the first buffer layer.

6. The method of claim 1, further comprising:
   forming a fourth dielectric layer over the third dielectric layer and the top electrode; and forming a second conductive feature in the fourth dielectric layer, the second conductive feature being in electrical contact with the top electrode.

7. A method comprising:
forming a first dielectric layer over a substrate;
forming a first conductive feature in the first dielectric layer;
forming a second dielectric layer over the first dielectric layer and the first conductive feature;
forming an opening in the second dielectric layer, the opening exposing a topmost surface of the first conductive feature;
filling the opening with a first conductive material to form a bottom electrode in the second dielectric layer;
recessing the bottom electrode below a top surface of the second dielectric layer to form a recess;
depositing a first buffer material in the recess to form a first buffer layer, a top surface of the first buffer layer being substantially level with the top surface of the second dielectric layer;
depositing a phase-change material over the second dielectric layer and the first buffer layer;
depositing a second conductive material over the phase-change material;
performing a patterning process to remove a portion of the phase-change material and a portion of the second conductive material, and to expose the top surface of the second dielectric layer, wherein a remaining portion of the phase-change material forms a phase-change layer and a remaining portion of the second conductive material forms a top electrode; and
forming a third dielectric layer over the second dielectric layer, the third dielectric layer surrounding the phase-change layer and the top electrode.

8. The method of claim 7, further comprising, before depositing the second conductive material over the phase-change material, depositing a second buffer material over the phase-change material.

9. The method of claim 8, wherein the patterning process further removes a portion of the second buffer material, a remaining portion of the second buffer material forming a second buffer layer.

10. The method of claim 9, wherein the first buffer layer and the second buffer layer comprise a same material.

11. The method of claim 9, wherein the first buffer layer and the second buffer layer comprise different materials.

12. The method of claim 7, wherein the third dielectric layer is in physical contact with sidewalls of the phase-change layer and sidewall of the top electrode, and wherein a top surface of the top electrode is substantially level with a top surface of the third dielectric layer.

13. The method of claim 7, wherein the bottom electrode and the top electrode comprise different conductive materials.

14. A method comprising:
forming a first interconnect structure over a substrate;
forming a first dielectric layer over the first interconnect structure;
forming a bottom electrode within the first dielectric layer;
forming a first buffer layer over the bottom electrode;
forming a phase-change layer over the first buffer layer, the phase-change layer being in physical contact with a top surface of the first dielectric layer, wherein a width of the phase-change layer is greater than a width of the bottom electrode;
forming a top electrode over the phase-change layer; and
forming a second dielectric layer over the first dielectric layer, wherein the second dielectric layer is in physical contact with sidewalls of the phase-change layer and sidewalls of the top electrode.

15. The method of claim 14, wherein the width of the phase-change layer is same as a width of the top electrode.

16. The method of claim 14, further comprising forming a second buffer layer between the phase-change layer and the top electrode.

17. The method of claim 16, wherein the width of the phase-change layer is same as a width of the second buffer layer.

18. The method of claim 14, wherein with the top surface of the first dielectric layer is substantially level with a top surface of the first buffer layer.

19. The method of claim 14, wherein the bottom electrode and the top electrode comprise a same conductive material.

20. The method of claim 14, further comprising forming a second interconnect structure over the second dielectric layer and the top electrode.

* * * * *